US010230338B2

(12) United States Patent
Nakajima

(10) Patent No.: US 10,230,338 B2
(45) Date of Patent: Mar. 12, 2019

(54) HIGH-FREQUENCY AMPLIFIER MODULE

(71) Applicant: Murata Manufacturing Co., Ltd., Kyoto (JP)

(72) Inventor: Reiji Nakajima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/682,924

(22) Filed: Aug. 22, 2017

(65) Prior Publication Data
US 2018/0062591 A1 Mar. 1, 2018

(30) Foreign Application Priority Data

Aug. 23, 2016 (JP) ................. 2016-162377

(51) Int. Cl.
H03F 1/14 (2006.01)
H03F 3/19 (2006.01)
H01L 29/737 (2006.01)
H03F 1/30 (2006.01)
H03F 3/343 (2006.01)
H01L 23/48 (2006.01)
H03F 3/195 (2006.01)
H03F 3/21 (2006.01)

(52) U.S. Cl.
CPC ............. H03F 3/19 (2013.01); H01L 23/48 (2013.01); H01L 29/737 (2013.01); H03F 1/302 (2013.01); H03F 3/195 (2013.01); H03F 3/211 (2013.01); H03F 3/3432 (2013.01); H03F 2200/108 (2013.01); H03F 2200/222 (2013.01); H03F 2200/387 (2013.01); H03F 2200/451 (2013.01); H03F 2200/492 (2013.01)

(58) Field of Classification Search
CPC ............. H03F 3/14; H03F 3/195; H03F 3/213
USPC ....................................... 330/307
See application file for complete search history.

(56) References Cited

U.S. PATENT DOCUMENTS

2010/0117737 A1* 5/2010 Kondo ................. H03F 1/0272
330/276
2012/0319778 A1 12/2012 Ng

FOREIGN PATENT DOCUMENTS

| JP | 2001-057511 A | 2/2001 |
| JP | 2004-193685 A | 7/2004 |
| JP | 2006-005643 A | 1/2006 |
| JP | 2012-089590 A | 5/2012 |
| JP | 2013-004786 A | 1/2013 |

* cited by examiner

Primary Examiner — Steven J Mottola
(74) Attorney, Agent, or Firm — Pearne & Gordon LLP

(57) ABSTRACT

A semiconductor substrate includes emitter electrodes for multiple high-frequency amplifying transistors. An insulating substrate includes multiple land electrodes, ground electrodes, and multiple inductor electrodes. The land electrodes are formed on the front surface or near the front surface of the insulating substrate, and are joined to the respective emitter electrodes. The ground electrodes are formed inside the insulating substrate. Each of the inductor electrodes couples a corresponding one of the land electrodes to any of the ground electrodes in such a manner that the lengths of the coupling to the ground electrodes are individually determined.

3 Claims, 5 Drawing Sheets

HIGH-FREQUENCY AMPLIFIER MODULE

This application claims priority of Japanese Patent Application No. 2016-162377 filed on Aug. 23, 2016. The content of this application is incorporated herein by reference in its entirety.

BACKGROUND OF THE DISCLOSURE

1. Field of the Disclosure

The present disclosure relates to a high-frequency amplifier module which amplifies a high frequency signal.

2. Description of the Related Art

Heretofore, various high-frequency amplifiers have become commercially practical. Some high-frequency amplifiers are used in power amplifiers amplifying transmission signals. For example, a high-frequency power amplifier described in Japanese Unexamined Patent Application Publication No. 2001-57511 is used in such a power amplifier.

The high-frequency power amplifier described in Japanese Unexamined Patent Application Publication No. 2001-57511 includes a heterojunction bipolar transistor (HBT) for amplifying a high frequency signal. The base of the HBT for amplifying a high frequency signal is coupled to a high-frequency signal input terminal through an input matching circuit. The collector of the HBT for amplifying a high frequency signal is coupled to a high-frequency signal output terminal through an output matching circuit. The emitter of the HBT for amplifying a high frequency signal is grounded through a characteristics adjusting inductor. A base bias is applied to the base of the HBT for amplifying a high frequency signal, and a drive voltage is applied to the collector.

In consideration of, for example, degradation in amplifying characteristics which is caused due to heat, the output level that may be achieved by a single high-frequency amplifying device (for example, the HBT for amplifying a high frequency signal which is described in Japanese Unexamined Patent Application Publication No. 2001-57511) is limiting. In this case, a configuration may be employed in which multiple high-frequency amplifying devices are used to amplify one high frequency signal, and in which the output signals from the high-frequency amplifying devices are combined with one another.

However, when output signals from multiple high-frequency amplifying devices are combined with one another, if the phases of the output signals do not match one another, the output level of the high-frequency amplifier is decreased.

BRIEF SUMMARY OF THE DISCLOSURE

Therefore, an object of the present disclosure is to provide a high-frequency amplifier module having excellent amplifying characteristics using multiple high-frequency amplifying devices.

A high-frequency amplifier module according to preferred embodiments of the present disclosure includes a semiconductor substrate and an insulating substrate. The semiconductor substrate includes a plurality of high-frequency amplifying transistors. The plurality of high-frequency amplifying transistors amplify a single high frequency signal. The insulating substrate has a front surface and a back surface. The front surface faces the back surface. The semiconductor substrate includes a plurality of emitter electrodes. The plurality of emitter electrodes are such that an emitter of each of the plurality of high-frequency amplifying transistors is coupled to a corresponding one of the plurality of emitter electrodes. The insulating substrate includes a plurality of land electrodes, a ground electrode, and a plurality of inductor electrodes. The plurality of land electrodes are formed on the front surface. Each of the plurality of land electrodes is joined to a corresponding one of the plurality of emitter electrodes. The ground electrode is formed inside the insulating substrate. The plurality of inductor electrodes couple the plurality of land electrodes to the ground electrode. The lengths of the coupling to the ground electrode are individually determined.

In the configuration, the inductor electrodes are used to perform phase adjustment for each of the output signals from the high-frequency amplifying transistors, which improves the combination efficiency.

Preferably, in the high-frequency amplifier module according to the preferred embodiments of the present disclosure, the shapes of the plurality of inductor electrodes are determined in accordance with a coupling form of the plurality of high-frequency amplifying transistors.

In the configuration, the phase difference between the output signals from the multiple high-frequency amplifying transistors which is produced in accordance with the coupling form is suppressed, which improves the combination efficiency.

The present disclosure achieves excellent amplifying characteristics by using multiple high-frequency amplifying devices.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
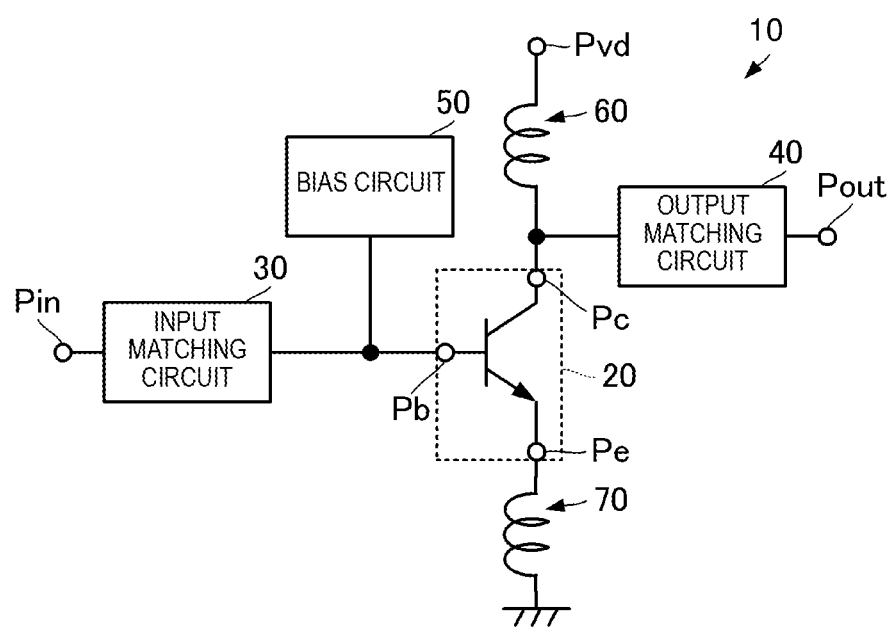
FIG. 1 is a schematic circuit block diagram illustrating a high-frequency amplifier module according to a first embodiment of the present disclosure.
Figure 2A:
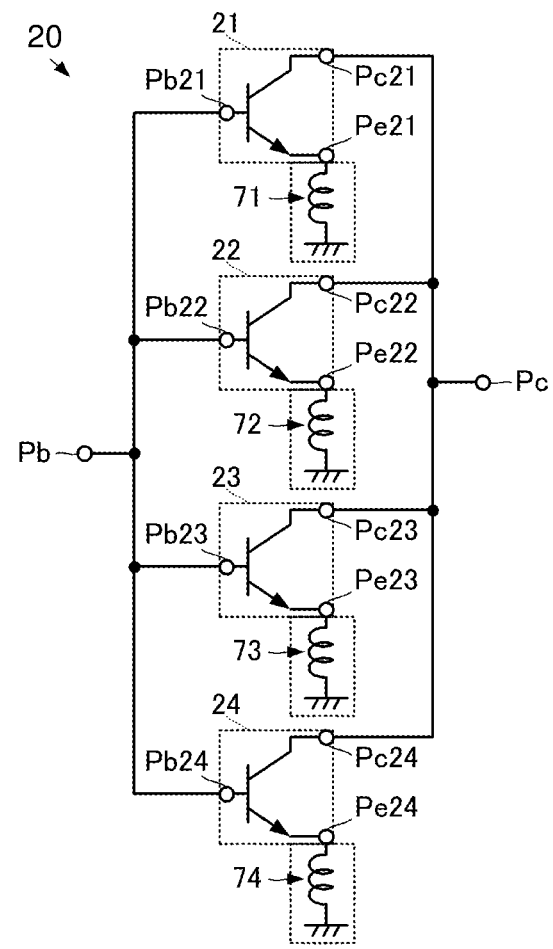
FIGS. 2A and 2B are circuit diagrams illustrating a detailed configuration of a high-frequency amplifying device according to the first embodiment of the present disclosure.
Figure 2B:
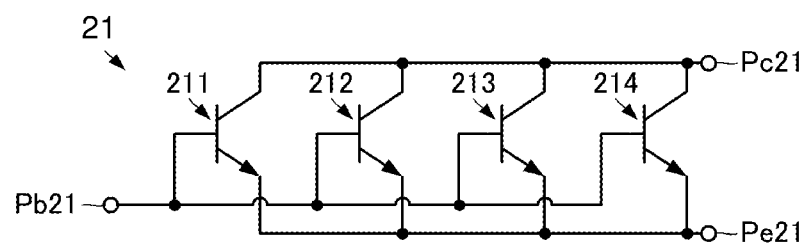

A high-frequency amplifier module according to a first embodiment of the present disclosure will be described with reference to the drawings. FIG. 1 is a schematic circuit block diagram illustrating a high-frequency amplifier module according to the first embodiment of the present disclosure. FIGS. 2A and 2B are circuit diagrams illustrating a detailed configuration of a high-frequency amplifying device according to the first embodiment of the present disclosure.

As illustrated in FIG. 1, a high-frequency amplifier module 10 includes a high-frequency amplifying device 20, an input matching circuit 30, an output matching circuit 40, a bias circuit 50, a choke coil 60, and a characteristics adjusting inductor 70. The high-frequency amplifier module 10 also includes a high-frequency signal input terminal Pin, a high-frequency signal output terminal Pout, and a drive-voltage applying terminal Pvd.

The high-frequency amplifying device 20 includes a base terminal Pb, a collector terminal Pc, and an emitter terminal Pe. The base terminal Pb is coupled to the high-frequency signal input terminal Pin through the input matching circuit 30. The base terminal Pb is coupled to the bias circuit 50. The collector terminal Pc is coupled to the drive-voltage applying terminal Pvd through the choke coil 60. The collector terminal Pc is coupled to the high-frequency signal output terminal Pout through the output matching circuit 40. The emitter terminal Pe is coupled to the ground through the characteristics adjusting inductor 70.

A bias voltage Vb is applied from the bias circuit 50, and a drive voltage Vd is applied from the drive-voltage applying terminal Pvd. Thus, the high-frequency amplifying device 20 amplifies a high frequency signal with an amplification factor according to the bias voltage Vb. At that time, the linearity of the high-frequency amplifying device 20 is improved by coupling the characteristics adjusting inductor 70 to the emitter terminal Pe. Thus, the high-frequency amplifying device 20 may amplify a high frequency signal with a desired amplification factor according to the bias voltage Vb while characteristics degradation such as occurrence of nonlinear distortion is reduced.

Further, the high-frequency amplifying device 20 and the characteristics adjusting inductor 70 include a configuration described below, achieving the high-frequency amplifier module 10 having excellent amplifying characteristics.

As illustrated in FIG. 2A, the high-frequency amplifying device 20 includes discrete amplifying devices 21, 22, 23, and 24. The discrete amplifying device 21 includes a base terminal Pb21, a collector terminal Pc21, and an emitter terminal Pe21. The discrete amplifying device 22 includes a base terminal Pb22, a collector terminal Pc22, and an emitter terminal Pe22. The discrete amplifying device 23 includes a base terminal Pb23, a collector terminal Pc23, and an emitter terminal Pe23. The discrete amplifying device 24 includes a base terminal Pb24, a collector terminal Pc24, and an emitter terminal Pe24.

As illustrated in FIG. 2A, the base terminal Pb21 of the discrete amplifying device 21, the base terminal Pb22 of the discrete amplifying device 22, the base terminal Pb23 of the discrete amplifying device 23, and the base terminal Pb24 of the discrete amplifying device 24 are coupled to the base terminal Pb of the high-frequency amplifying device 20. At least one coupling distance among the coupling distances between the base terminal Pb and the base terminal Pb21, Pb22, Pb23, and Pb24 is different from the other coupling distances. In the case of FIG. 2A, the coupling distance between the base terminal Pb and the base terminal Pb22 is substantially the same as the coupling distance between the base terminal Pb and the base terminal Pb23, and the coupling distance between the base terminal Pb and the base terminal Pb21 is substantially the same as the coupling distance between the base terminal Pb and the base terminal Pb24. The coupling distance between the base terminal Pb and the base terminal Pb21 is different from the coupling distance between the base terminal Pb and the base terminal Pb22.

The collector terminal Pc21 of the discrete amplifying device 21, the collector terminal Pc22 of the discrete amplifying device 22, the collector terminal Pc23 of the discrete amplifying device 23, and the collector terminal Pc24 of the discrete amplifying device 24 are coupled to the collector terminal Pc of the high-frequency amplifying device 20. At least one coupling distance among the coupling distances between the collector terminal Pc and the collector terminals Pc21, Pc22, Pc23, and Pc24 is different from the other coupling distances. In the case of FIG. 2A, the coupling distance between the collector terminal Pc and the collector terminal Pc22 is substantially the same as the coupling distance between the collector terminal Pc and the collector terminal Pc23, and the coupling distance between the collector terminal Pc and the collector terminal Pc21 is substantially the same as the coupling distance between the collector terminal Pc and the collector terminal Pc24. The coupling distance between the collector terminal Pc and the collector terminal Pc21 is different from the coupling distance between the collector terminal Pc and the collector terminal Pc22.

The emitter terminal Pe21 of the discrete amplifying device 21 is coupled to the ground through a characteristics adjusting inductor 71. The emitter terminal Pe22 of the discrete amplifying device 22 is coupled to the ground through a characteristics adjusting inductor 72. The emitter terminal Pe23 of the discrete amplifying device 23 is coupled to the ground through a characteristics adjusting inductor 73. The emitter terminal Pe24 of the discrete amplifying device 24 is coupled to the ground through a characteristics adjusting inductor 74. These characteristics adjusting inductors 71, 72, 73, and 74 form the characteristics adjusting inductor 70 of the high-frequency amplifying device 20.

Each of the discrete amplifying devices 21, 22, 23, and 24 has substantially the same circuit configuration. Specifically, each of the discrete amplifying devices 21, 22, 23, and 24 has the circuit configuration illustrated in FIG. 2B. FIG. 2B illustrates the discrete amplifying device 21. The configuration of the discrete amplifying device 21 will be described below.

The discrete amplifying device 21 includes multiple high-frequency amplifying transistors 211, 212, 213, and 214. The bases of the high-frequency amplifying transistors 211, 212, 213, and 214 are coupled to the base terminal Pb21. The coupling distances between the bases of the high-frequency amplifying transistors 211, 212, 213, and 214 and the base terminal Pb21 are substantially the same. The collectors of the high-frequency amplifying transistors 211, 212, 213, and 214 are coupled to the collector terminal Pc21. The coupling distances between the collectors of the high-frequency amplifying transistors 211, 212, 213, and 214 and the collector terminal Pc21 are substantially the same. The emitters of the high-frequency amplifying transistors 211, 212, 213, and 214 are coupled to the emitter terminal Pe21. The coupling distances between the emitters of the high-frequency amplifying transistors 211, 212, 213, and 214 and the emitter terminal Pe21 are substantially the same.

In the high-frequency amplifier module 10 having such a configuration, a high frequency signal received at the base terminal Pb is inputted to each of the discrete amplifying devices 21, 22, 23, and 24 for amplification. Output signals obtained through amplification in the respective discrete amplifying devices 21, 22, 23, and 24 are combined with one another at the collector terminal Pc for output.

The inductances of the characteristics adjusting inductors 71, 72, 73, and 74 are determined in accordance with the coupling form of the discrete amplifying devices 21, 22, 23, and 24. Specifically, the inductances of the characteristics adjusting inductors 71, 72, 73, and 74 are determined so that output signals from the discrete amplifying devices 21, 22, 23, and 24 have substantially the same phase (more preferably, the same phase) at the collector terminal Pc of the high-frequency amplifying device 20.

Thus, the combination efficiency of output signals from the discrete amplifying devices 21, 22, 23, and 24 in the high-frequency amplifying device 20 is improved. Therefore, the amplifying characteristics of the high-frequency amplifier module 10 are improved.

Figure 3:
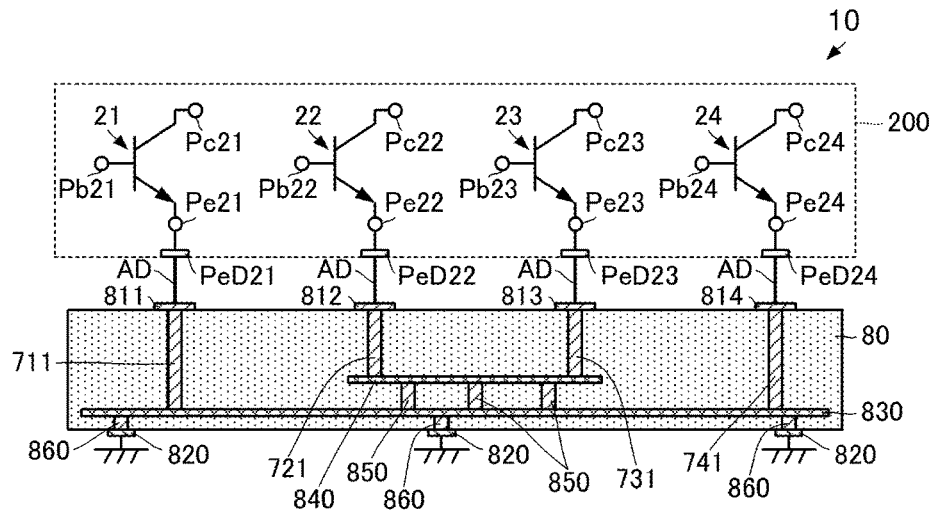
FIG. 3 is a diagram illustrating a schematic configuration of the high-frequency amplifier module according to the first embodiment of the present disclosure.
Figure 4:
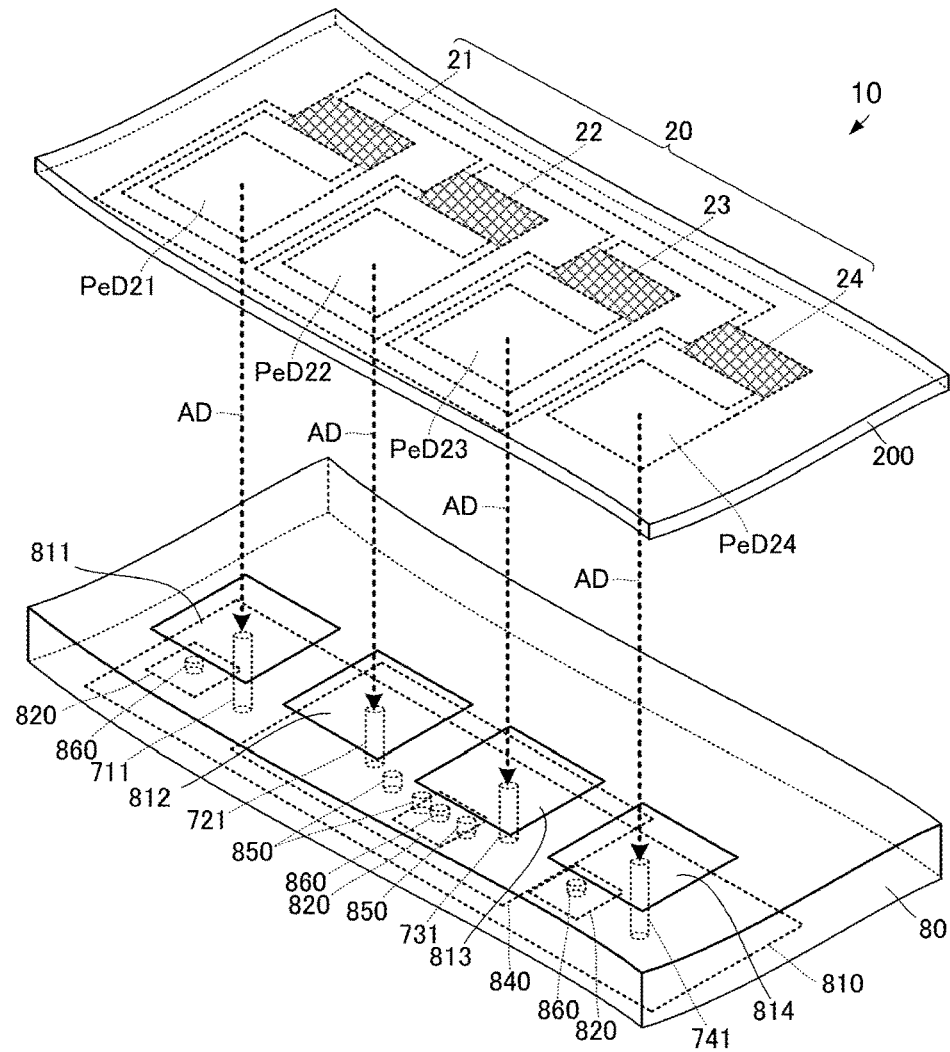
FIG. 4 is a partial external perspective view of a schematic configuration of the high-frequency amplifier module according to the first embodiment of the present disclosure.

To implement such a circuit configuration, the high-frequency amplifier module 10 has the following configuration. FIG. 3 is a diagram illustrating a schematic configuration of the high-frequency amplifier module according to the first embodiment of the present disclosure. FIG. 4 is a partial external perspective view of the schematic configuration of the high-frequency amplifier module according to the first embodiment of the present disclosure.

As illustrated in FIGS. 3 and 4, the discrete amplifying devices 21, 22, 23, and 24 are formed in or on a semiconductor substrate 200. Each of the high-frequency amplifying transistors of the discrete amplifying devices 21, 22, 23, and 24 has, for example, a heterojunction bipolar transistor (HBT) configuration.

Emitter electrodes PeD21, PeD22, PeD23, and PeD24 are formed on the back surface of the semiconductor substrate 200. The planar area of each of the emitter electrodes PeD21, PeD22, PeD23, and PeD24 is preferably larger than the area of a region in which a corresponding one of the discrete amplifying devices 21, 22, 23, and 24 is formed. Thus, the heat dissipation effect of each of the discrete amplifying devices 21, 22, 23, and 24 is improved.

The base terminals Pb21, Pb22, Pb23, and Pb24 of the discrete amplifying devices 21, 22, 23, and 24 are coupled by using a base electrode pattern to which no reference characters are assigned in FIG. 4 and which is formed on the back surface of the semiconductor substrate 200. The base electrode pattern is coupled to an electrode pad (not illustrated) forming the base terminal Pb. The collector terminals Pc21, Pc22, Pc23, and Pc24 of the discrete amplifying devices 21, 22, 23, and 24 are coupled by using a collector electrode pattern formed on the back surface of the semiconductor substrate 200. The collector electrode pattern is coupled to an electrode pad (not illustrated) forming the collector terminal Pc.

In and on an insulating substrate 80, circuit configuration components other than the high-frequency amplifying device 20 in the high-frequency amplifier module 10 illustrated in FIG. 1 are formed or mounted (not illustrated).

The insulating substrate 80 has a front surface and a back surface which face each other. Land electrodes 811, 812, 813, and 814 are formed on the front surface of the insulating substrate 80. The emitter electrode PeD21 is joined to the land electrode 811 through a conductive bonding material AD. The emitter electrode PeD22 is joined to the land electrode 812 through the conductive bonding material AD. The emitter electrode PeD23 is joined to the land electrode 813 through the conductive bonding material AD. The emitter electrode PeD24 is joined to the land electrode 814 through the conductive bonding material AD. The conductive bonding material AD is solder or the like. For example, solder bumps or the like which are formed in advance on the emitter electrodes PeD21, PeD22, PeD23, and PeD24 may be used.

Multiple ground terminal electrodes 820 are formed on the back surface of the insulating substrate 80. The ground terminal electrodes 820 are coupled to the ground through other circuit substrates and the like.

Ground electrodes 830 and 840 are formed inside the insulating substrate 80. Each of the ground electrodes 830 and 840 is an electrode pattern having a plane orthogonal to the thickness direction of the insulating substrate 80.

The ground electrodes 830 and 840 are disposed at certain positions in the thickness direction of the insulating substrate 80. The ground electrode 830 is disposed near the back surface of the insulating substrate 80. The ground electrode 840 is disposed between the ground electrode 830 and the front surface of the insulating substrate 80.

The ground electrode 830 covers the land electrodes 811, 812, 813, and 814 when the insulating substrate 80 is viewed in plan (viewed in the thickness direction). More preferably, the ground electrode 830 is formed substantially over the entire surface of the insulating substrate 80 when the insulating substrate 80 is viewed in plan.

The ground electrode 840 covers the land electrodes 812 and 813 when the insulating substrate 80 is viewed in plan. The ground electrode 840 does not cover the land electrodes 811 and 814 when the insulating substrate 80 is viewed in plan. The area of the ground electrode 840 is smaller than the area of the ground electrode 830.

Inductor electrodes 711, 721, 731, and 741 are formed in the insulating substrate 80. Each of the inductor electrodes 711, 721, 731, and 741 is an electrode extending in the thickness direction of the insulating substrate 80.

The inductor electrode 711 couples the land electrode 811 to the ground electrode 830. The inductor electrode 721 couples the land electrode 812 to the ground electrode 840. The inductor electrode 731 couples the land electrode 813 to the ground electrode 840. The inductor electrode 741 couples the land electrode 814 to the ground electrode 830.

Multiple auxiliary ground electrodes 850 are formed in the insulating substrate 80. The auxiliary ground electrodes 850 are electrodes extending in the thickness direction of the insulating substrate 80. The auxiliary ground electrodes 850 are formed in a region in which the ground electrode 840 superposes the ground electrode 830 when the insulating substrate 80 is viewed in plan. The auxiliary ground electrodes 850 couple the ground electrode 830 to the ground electrode 840. Preferably, the auxiliary ground electrodes 850 are short. An adverse effect of the inductances of the auxiliary ground electrodes 850 is suppressed by making the auxiliary ground electrodes 850 short. It is preferable to increase the number of auxiliary ground electrodes 850. Increasing the number of auxiliary ground electrodes 850 makes the potential difference between the ground electrode 840 and the ground electrode 830 small, and makes the inductances of the electrode portions coupling the ground electrode 840 to the ground electrode 830 small.

In such a configuration, the characteristics adjusting inductor 71 in FIG. 2A is implemented by using the inductor electrode 711, and the characteristics adjusting inductor 72 in FIG. 2A is implemented by using the inductor electrode 721. The characteristics adjusting inductor 73 in FIG. 2A is implemented by using the inductor electrode 731, and the characteristics adjusting inductor 74 in FIG. 2A is implemented by using the inductor electrode 741.

As illustrated in FIG. 3, the shape of the inductor electrode 711 is substantially the same as the shape of the inductor electrode 741, and the shape of the inductor electrode 721 is substantially the same as the shape of the inductor electrode 731. Further, the shape of the inductor electrodes 711 and 741 is different from the shape of the inductor electrodes 721 and 731. Specifically, the length of the inductor electrodes 711 and 741 is different from the length of the inductor electrodes 721 and 731. Thus, the inductance of the characteristics adjusting inductor 71 is substantially the same as the inductance of the characteristics adjusting inductor 74, and the inductance of the characteristics adjusting inductor 72 is substantially the same as the inductance of the characteristics adjusting inductor 73. Further, the inductance of the characteristics adjusting inductor 71 and the characteristics adjusting inductor 74 is different from the inductance of the characteristics adjusting inductor 72 and the characteristics adjusting inductor 73.

In the high-frequency amplifier module 10 having such a configuration, the inductances of the characteristics adjusting inductors 71, 72, 73, and 74 may be determined for the respective discrete amplifying devices 21, 22, 23, and 24. Therefore, as described above, while the linearity of the discrete amplifying devices 21, 22, 23, and 24 is surely obtained, the combination efficiency of output signals from the discrete amplifying devices 21, 22, 23, and 24 is improved. Thus, the high-frequency amplifier module 10 may achieve excellent amplifying characteristics.

Figure 5A:
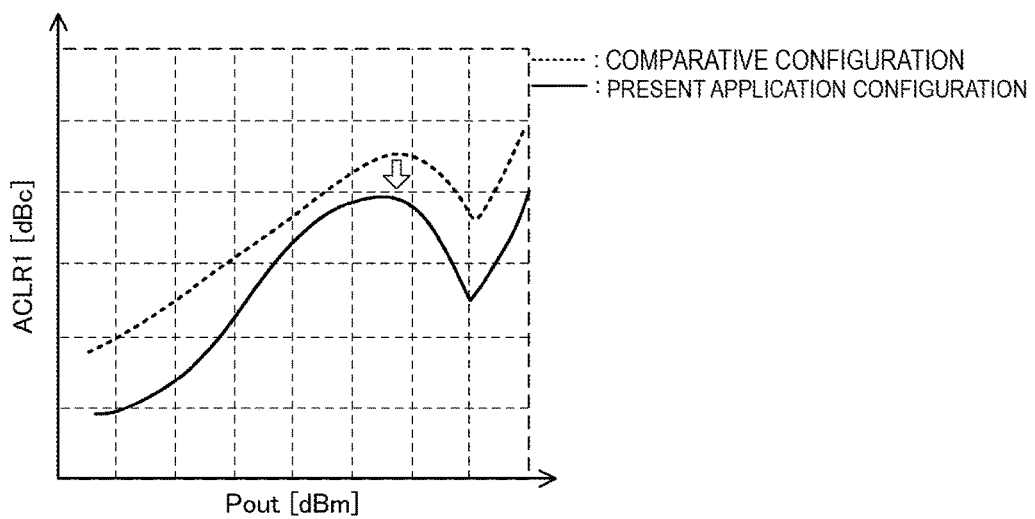
FIGS. 5A and 5B are diagrams illustrating the adjacent channel leakage ratio (ACLR) characteristics of the high-frequency amplifier module according to the first embodiment of the present disclosure.
Figure 5B:
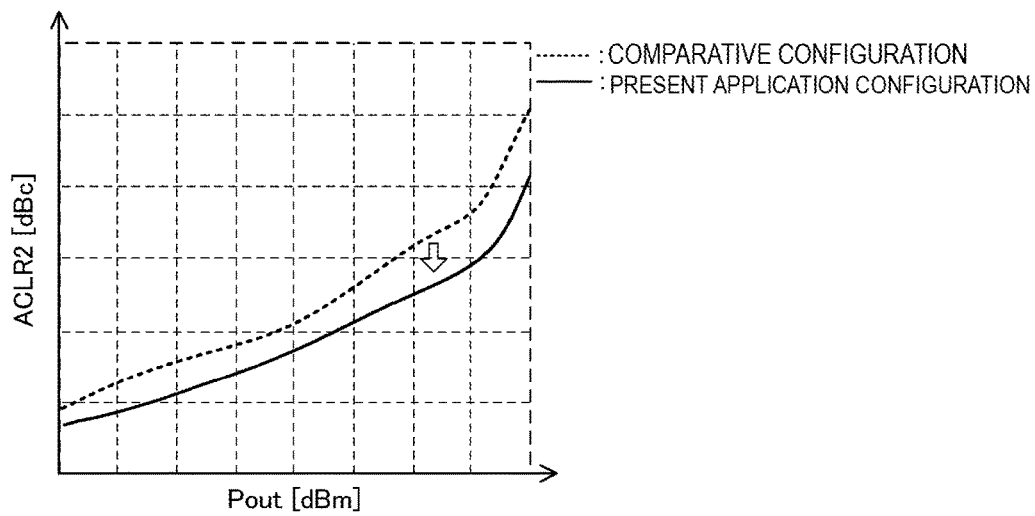

FIGS. 5A and 5B are diagrams illustrating the adjacent channel leakage ratio (ACLR) characteristics of the high-frequency amplifier module according to the first embodiment of the present disclosure. FIG. 5A illustrates ACLRs for adjacent 5-MHz bandwidth, and FIG. 5B illustrates ACLRs for adjacent 10-MHz bandwidth. In FIGS. 5A and 5B, a solid line represents the characteristics provided by the disclosure of the subject application, and a broken line represents the characteristics of a comparative configuration. The comparative configuration is a configuration in which all of the emitter electrodes are directly coupled to a ground electrode common to the emitter electrodes.

As illustrated in FIGS. 5A and 5B, for both of the bandwidths, the ACLR of the high-frequency amplifier module 10 according to the first embodiment is better than the ACLR of the comparative configuration.

Figure 6:
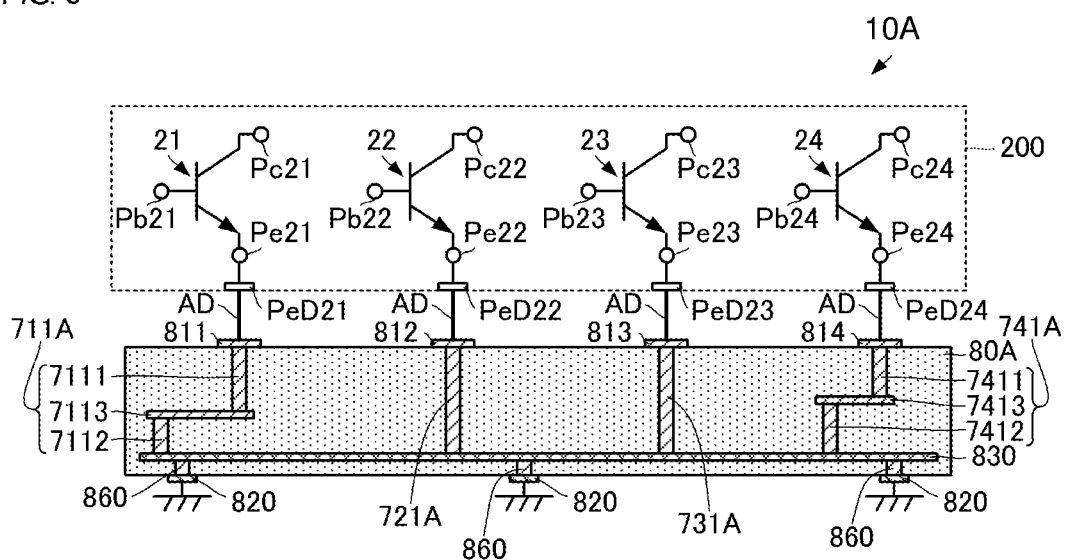
FIG. 6 is a diagram illustrating a schematic configuration of a high-frequency amplifier module according to a second embodiment of the present disclosure.

A high-frequency amplifier module according to a second embodiment of the present disclosure will be described with reference to the drawing. FIG. 6 is a diagram illustrating a schematic configuration of the high-frequency amplifier module according to the second embodiment of the present disclosure.

A high-frequency amplifier module 10A according to the second embodiment is different from the high-frequency amplifier module 10 according to the first embodiment in that the configuration of characteristics adjusting inductors is different. Specifically, the shapes of inductor electrodes according to the second embodiment are different from those according to the first embodiment. The other configuration of the high-frequency amplifier module 10A is substantially the same as the configuration of the high-frequency amplifier module 10, and portions that are substantially the same will not be described.

As illustrated in FIG. 6, inductor electrodes 711A, 721A, 731A, and 741A are formed in an insulating substrate 80A. The insulating substrate 80A does not include the ground electrode 840 illustrated in the first embodiment.

The inductor electrode 711A couples the land electrode 811 to the ground electrode 830. The inductor electrode 711A includes thickness-direction coupling electrodes 7111 and 7112 and a routing electrode 7113. The routing electrode 7113 is a linear electrode extending in a plane orthogonal to the thickness direction. One end of the thickness-direction coupling electrode 7111 is coupled to the land electrode 811. The other end of the thickness-direction coupling electrode 7111 is coupled to one end of the routing electrode 7113. The other end of the routing electrode 7113 is coupled to one end of the thickness-direction coupling electrode 7112. The other end of the thickness-direction coupling electrode 7112 is coupled to the ground electrode 830. Thus, the inductor electrode 711A has a shape substantially longer than a shape in which in-line coupling is performed between the land electrode 811 and the ground electrode 830. Therefore, this produces an inductance larger than the inductance of a shape of in-line coupling.

The inductor electrode 721A couples the land electrode 812 to the ground electrode 830. The inductor electrode 731A couples the land electrode 813 to the ground electrode 830.

The inductor electrode 741A couples the land electrode 814 to the ground electrode 830. The inductor electrode 741A includes thickness-direction coupling electrodes 7411 and 7412 and a routing electrode 7413. The routing electrode 7413 is a linear electrode extending in a plane orthogonal to the thickness direction. One end of the thickness-direction coupling electrode 7411 is coupled to the land electrode 814. The other end of the thickness-direction coupling electrode 7411 is coupled to one end of the routing electrode 7413. The other end of the routing electrode 7413 is coupled to one end of the thickness-direction coupling electrode 7412. The other end of the thickness-direction coupling electrode 7412 is coupled to the ground electrode 830. Thus, the inductor electrode 741A has a shape substantially longer than a shape in which in-line coupling is performed between the land electrode 811 and the ground electrode 830. Therefore, this produces an inductance larger than the inductance of a shape of in-line coupling.

Thus, the configuration according to the second embodiment also enables the inductance of the characteristics adjusting inductor coupled to each of the discrete amplifying devices 21, 22, 23, and 24 to be appropriately set.

In the embodiments described above, the case in which a pair of characteristics adjusting inductors having the same inductance is included is described. However, the inductances of the characteristics adjusting inductors may be appropriately set in accordance with the coupling form of the discrete amplifying devices 21, 22, 23, and 24 and the coupling form of the high-frequency amplifying transistors included in each of the discrete amplifying devices 21, 22, 23, and 24 so that the combination efficiency is improved.

In the embodiments described above, the mode in which the number of discrete amplifying devices forming the high-frequency amplifying device 20 is four, and in which the number of high-frequency amplifying transistors forming a discrete amplifying device is four is described. These numbers may be appropriately set in accordance with an output level, heat dissipation, amplifying characteristics, and the like necessary as a high-frequency amplifier module.

In the above description, the mode in which at least one inductor electrode among multiple inductor electrodes is different from the other inductor electrodes in length is described. However, the shapes of all of the inductor electrodes may be substantially the same in accordance with the coupling mode of discrete amplifying devices.

While preferred embodiments of the disclosure have been described above, it is to be understood that variations and modifications will be apparent to those skilled in the art without departing from the scope and spirit of the disclosure.

The scope of the disclosure, therefore, is to be determined solely by the following claims.

What is claimed is:

1. A high-frequency amplifier module comprising:
a semiconductor substrate including a plurality of high-frequency amplifying transistors, the plurality of high-frequency amplifying transistors amplifying a single high frequency signal; and
an insulating substrate having a front surface and a back surface, the front surface facing the back surface,
wherein the semiconductor substrate includes a plurality of emitter electrodes, an emitter of each of the plurality of high-frequency amplifying transistors is coupled to a corresponding one of the plurality of emitter electrodes, and
wherein the insulating substrate includes
a plurality of land electrodes provided on the front surface, each of the plurality of land electrodes being joined to a corresponding one of the plurality of emitter electrodes,
a ground electrode provided inside the insulating substrate, and
a plurality of inductor electrodes coupling the plurality of land electrodes to the ground electrode, lengths of the coupling to the ground electrode being individually determined.

2. The high-frequency amplifier module according to claim 1,
wherein shapes of the plurality of inductor electrodes are determined in accordance with a coupling mode of the plurality of high-frequency amplifying transistors.

3. The high-frequency amplifier module according to claim 1, wherein the ground electrode is a first ground electrode, the high-frequency amplifier module further comprising:
a second ground electrode provided inside the insulating substrate; and
a plurality of auxiliary ground electrodes coupling the first ground electrode to the second ground electrode.

* * * * *